(12) United States Patent
Pyon et al.

(10) Patent No.: US 9,941,033 B2
(45) Date of Patent: Apr. 10, 2018

(54) METHODS AND SYSTEMS FOR PREPARING SUPERCONDUCTORS FOR REACTION AND INTEGRATION

(71) Applicant: Luvata Waterbury, Inc., Waterbury, CT (US)

(72) Inventors: Taeyoung Pyon, Watertown, CT (US); Hem Kanithi, Cheshire, CT (US)

(73) Assignee: LUVATA WATERBURY, INC., Waterbury, CT (US)

( * ) Notice: Subject to any disclaimer, the term of this patent is extended or adjusted under 35 U.S.C. 154(b) by 1154 days.

(21) Appl. No.: 14/205,940

(22) Filed: Mar. 12, 2014

(65) Prior Publication Data

US 2016/0163427 A1    Jun. 9, 2016

(51) Int. Cl.
| | |
|---|---|
| H01B 13/00 | (2006.01) |
| H01B 12/06 | (2006.01) |
| H01B 12/04 | (2006.01) |
| H01L 39/24 | (2006.01) |
| B23K 1/00 | (2006.01) |
| B23K 1/19 | (2006.01) |

(52) U.S. Cl.
CPC ....... *H01B 13/0036* (2013.01); *B23K 1/0008* (2013.01); *B23K 1/19* (2013.01); *H01B 12/04* (2013.01); *H01B 12/06* (2013.01); *H01B 13/0003* (2013.01); *H01B 13/0016* (2013.01); *H01L 39/2409* (2013.01); *H01L 39/2487* (2013.01); *Y10T 29/49014* (2015.01)

(58) Field of Classification Search
CPC   H01B 13/0036; H01B 13/0016; H01B 12/06; B65H 75/20; B65H 75/18; B65H 75/14–75/148; H01L 39/2487; Y10T 29/49014
See application file for complete search history.

(56) References Cited

U.S. PATENT DOCUMENTS

| | | | | |
|---|---|---|---|---|
| 3,559,127 | A * | 1/1971 | Schindler | H01F 6/02 174/125.1 |
| 5,104,746 | A * | 4/1992 | Taub | H01L 39/2409 428/614 |
| 5,123,586 | A * | 6/1992 | Woolf | H01L 39/248 228/124.5 |
| 5,394,130 | A | 2/1995 | Xu et al. | |
| 5,660,541 | A * | 8/1997 | Woolf | H01L 39/248 34/104 |

(Continued)

FOREIGN PATENT DOCUMENTS

| | | |
|---|---|---|
| JP | S61264609 A | 11/1986 |
| JP | H04274115 A | 9/1992 |

(Continued)

*Primary Examiner* — Livius R Cazan
(74) *Attorney, Agent, or Firm* — Hodgson Russ LLP (57) ABSTRACT

A method and system for manufacturing a superconducting material is described. In one embodiment, a layer of refractory cushion is placed over a spool. A first layer of superconducting cable is wound over the first layer of refractory cloth. The superconducting cable is reaction heat-treated on the spool. A first layer of refractory fabric can be placed over the layer of refractory cushion. One or more adjustment mechanisms can be disposed between the first layer of the superconducting cable and the spool.

22 Claims, 8 Drawing Sheets

(56) References Cited

U.S. PATENT DOCUMENTS

| | | | | |
|---|---|---|---|---|
| 5,798,678 A | * | 8/1998 | Manlief | H01F 6/06 |
| | | | | 174/125.1 |
| 5,934,606 A | * | 8/1999 | Guild | B65H 75/146 |
| | | | | 242/603 |
| 2004/0250410 A1 | | 12/2004 | Grasso et al. | |
| 2009/0107395 A1 | * | 4/2009 | Ha | H01L 39/2422 |
| | | | | 118/50 |

FOREIGN PATENT DOCUMENTS

| | | | |
|---|---|---|---|
| JP | H06325631 A | | 11/1994 |
| JP | 10135061 A | * | 5/1998 |
| JP | 2007081128 A | | 3/2007 |

\* cited by examiner

3a - Strain behavior of IT Nb3Sn wire with higher SC fraction
3b - Strain behavior of IT Nb3Sn wire with lower SC fraction

METHODS AND SYSTEMS FOR PREPARING SUPERCONDUCTORS FOR REACTION AND INTEGRATION

FIELD OF THE DISCLOSURE

The disclosure generally relates to the manufacture of superconductors.

BACKGROUND OF THE DISCLOSURE

One method used to fabricate superconducting wires with multi- and mono-filament composite conductors is the Wind-And-React (WAR) process. In this process, the eventual conducting material is typically considered to be a "precursor" until after a final heat-treating and oxidation step. The WAR method as applied to high temperature superconductors requires that the precursor be insulated before coil formation, and entails winding the coil immediately prior to a final heat-treating and oxidation step in the fabrication process. The WAR process as applied to high temperature superconductors requires that the precursor be wound in coil-form for high-field magnet application prior to the final heat-treatment. This final step results in the repair of micro-cracks incurred during winding, and is used to optimize the superconducting properties of the conductor. However, these results are significantly more difficult to achieve for a coil geometry than for the individual wires which are heat-treated and oxidized in a React-And-Wind (RAW) method. The RAW method, involves heat-treating the wire prior to coiling.

The RAW method involves the formation of a superconductor precursor which is then wound into a coil. In this method, a precursor to a composite conductor is fabricated and placed in a linear geometry, or wrapped loosely around a spool, and placed in a furnace for processing. The precursor can therefore be surrounded by a vacuum or inert gas environment during processing, which is necessary for conversion to the desired superconducting state. In the RAW processing method, insulation can be applied after the composite conductor is processed. In some cases, the RAW process can be advantageous in that it does not suffer from issues such as the oxygen permeability and thermal decomposition of the insulating layer.

Both WAR and RAW processes have their own merits. The WAR process is advantageous when the material in its superconducting state is brittle because it limits handling. However, the WAR process is expensive for large coils, partly, due to a necessary epoxy vacuum impregnation process for interstrand electrical insulation as well as associated furnace costs. The RAW process can be advantageous in terms of cost because insulation can be applied before coiling and smaller furnaces can be used when producing large coils. Another advantage of the RAW process is that mechanical damage in the strand can be inspected for and repaired during the coiling process. Due to the mechanical properties of the conducting material, superconducting magnetic coils fabricated using the WAR method with monostrand composite conductors have limitations related to winding density and current-carrying ability. Although the final step of the WAR method may repair strain-induced damage to the superconducting material incurred during winding, the coils produced are not mechanically robust, and thermal strain resulting from cool down cycles can degrade the coil performance over time.

An important issue for the fabrication of superconducting coils is the strain state of the conductor. Reaction heat-treatment of a superconducting precursor to form the superconducting phase causes the superconductor to undergo dimensional changes and introduces strain to the superconductor. For example, in $Nb_3Sn$ conductors, dimensional changes in an unconstrained superconductor under a heat-treat cycle can include: (1) changes during annealing due to stress relief; and (2) changes due to the formation of Cu—Sn intermetallics and finally formation of $Nb_3Sn$ phase. For strand conductors, the residual stresses after the drawing process are proportioned such that the niobium filaments are under tension while the copper matrix is under compression. At 200° C. the copper matrix begins to stress relieve and soften allowing the niobium filaments to relax via contraction resulting in permanent contraction of the strand. Two mechanisms can mitigate the contraction of the strand. Firstly, for wire with physically constrained ends, the niobium will maintain a tension stress state until it undergoes stress relief at 650° C. resulting in permanent deformation of the niobium component and an elongation contribution to the strand when cooled back down to room temperature. Secondly, since 1 mole of $Nb_3Sn$ has a larger volume than 3 mole niobium and one mole of tin some expansion does take place partially negating the contraction. The elongation contribution creates a problem because in order to avoid strand breakage during heat-treatment due to the stress relief contraction the strand must be spooled with minimal tension applied, but due to the expansion contribution, sufficient pay-off tensions cannot be realized. In some cases, an interlayer gap can form resulting in strand damage during pay-off due to strand bending. The contraction of the strand can be avoided by pre-heat-treat stress relief, but expansion can still occur due to the formation of the $Nb_3Sn$ phase.

Wire-in-channel (or cable-in-channel) superconductors are often passed through a die to press a superconductive material into a groove of a channel. The die may also serve to draw the conductor to a final cross-section, and in doing so may deform the channel to more securely retain the superconductive material in the channel. However, due to the brittle nature of the superconductive material, deforming the channel can apply stresses to the superconductive material.

Exceeding the critical strain value of the superconductor wire results in severe degradation of the electrical properties of the superconductor. Therefore, handling a superconductor precursor after reaction in the RAW process can be difficult.

BRIEF SUMMARY OF THE DISCLOSURE

The present disclosure can be embodied as a method of manufacturing a superconducting material. In the context of the present specification, the term superconducting "cable" should be understood as also including a superconducting "strand." The method can include placing a layer of refractory cushion over a spool. A first layer of superconducting cable can be wound over the refractory cushion layer. The superconducting cable can be reaction heat-treated while on the spool. The first layer of superconducting cable can be unwound from the spool.

In another embodiment, the disclosure can be embodied as a method of manufacturing a superconducting material, such as a strand or cable. A heat-treatment spool can be provided. The heat-treatment spool can include a metal sheet layer over the spool, a layer of refractory cushion over the metal sheet layer, and a first layer of refractory cloth over the layer of refractory cushion. A first layer of superconducting cable can be wound about the first layer of refractory cloth. A second layer of refractory cloth can be placed over the superconducting cable. The superconducting cable can be heat-treated on the spool. One or more wedging fixtures can be installed between the metal sheet and the spool after heat-treating the superconducting cable on the spool. The wedging fixtures may be installed in a gap between the first layer of the superconducting cable and the spool, the gap being formed from a difference in thermal expansion properties between the spool and the superconducting cable. The superconducting cable can be unwound from the spool. The reacted superconducting cable can be soldered to a copper channel.

The present disclosure may also be embodied as a system for manufacturing a superconducting material. The system can include a spool, a metal sheet layer positioned over the spool, a refractory cushion layer positioned over the metal sheet, and a first layer of refractory cloth sheet over the refractory cushion layer. A layer of heat-treated superconducting cable may be wound over the first layer of refractory cloth sheet. A second layer of refractory cloth sheet can be positioned over the layer of superconducting cable. A plurality of wedging fixtures may be between the metal sheet layer and the spool.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

The present disclosure can be embodied as the manufacture of a superconducting coil. As an overview, this process may include four general steps. First, an unreacted superconducting cable (or wire) can be prepared and reaction heat-treated such that the precursor material forms a superconducting phase. Second, the reacted superconducting cable can be prepared to be joined with a channel. Third, the superconducting cable can be integrated with the channel. "Integration" is the process of joining, usually through soldering, the reacted superconducting cable with a channel, for example, a copper channel. Fourth, the cable-in-channel superconductor can be wound into a finished superconducting coil for use (according to the React-and-Wind method described earlier). In the context of the present application, the term "cable" can also include a strand of material, as known to those skilled in the art. It is also appreciated that the disclosure may refer to a superconductor material in "wire" or "cable" form, and that the teachings could be applied to either form of superconductor (i.e. a wire or cable).

Preparing the superconducting wire can begin with providing an unreacted superconducting material, including a high-temperature superconductor, $Nb_3Sn$, $MgB_2$, or other precursors necessary to form the superconducting phase through a heat treat cycle. The unreacted superconducting material, such as strand or cable filament, can begin as an elongated group of strands having a generally circular cross-section. The strands can be a metal-worked assembly, for example, an assembly that has undergone drawing, swaging, extrusion, rolling, or related processes with or without applied heat.

Figure 1:
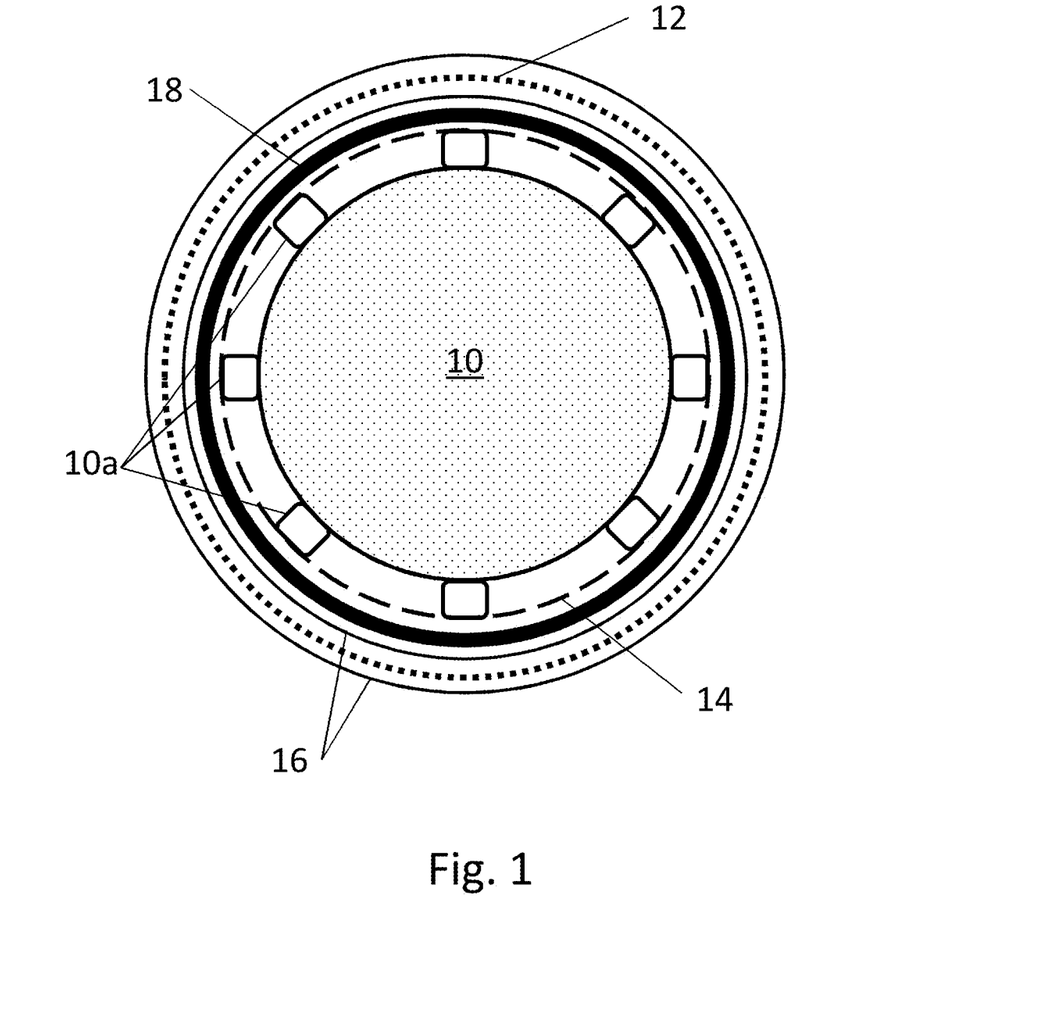
FIG. 1 is a schematic representation of a heat-treatment spool and layers of material prior to reaction heat-treatment.

FIG. 1 depicts a heat-treatment spool 10 that may be used to receive the unreacted superconducting cable 12. Preparing the heat-treatment spool 10 can include layering a metal sheet 14, such as a steel sheet over the outer circumference of the spool 10. The metal sheet 14 can be chosen such that it does not fuse to the spool 10 or other refractory materials 16, 18 during heat-treatment. A refractory cushion layer 18 can be placed about the metal sheet layer 14. The refractory cushion layer 18 can be made of a suitable refractory material that allows the superconducting cable 12 to contract or expand during heat-treatment. In this manner, it is advantageous that the cushion layer 18 be a compressible, "pad" layer. The cushion layer can have a sufficient thickness to allow for a suitable amount of compression to occur during heat treatment, for example, about 0.25 to 0.5 inches thick. The refractory cushion layer 18 can be a refractory ceramic fiber (RCF), which typically comprises alumina and silica. A suitable alumino-silicate ceramic fiber is commercially available from Unifrax LLC (Niagara Falls, N.Y.) under the registered trademark FIBERFRAX. The FIBERFRAX® ceramic fibers comprise the fiberization product of a melt comprising from about 45 to about 75 weight percent alumina and from about 25 to about 55 weight percent silica. The FIBERFRAX® fibers exhibit operating temperatures of up to about 1540° C. and a melting point up to about 1870° C. In certain embodiments, the alumino-silicate fiber may comprise from about 40 weight percent to about 60 weight percent Al2O3 and from about 60 weight percent to about 40 weight percent SiO2, and in some embodiments, from about 47 to about 53 weight percent alumina and from about 47 to about 53 weight percent silica.

The unreacted superconducting cable 12 can be wound about the refractory cushion layer 18. To protect the unreacted superconducting cable 12 from fusing and/or breaking during heat-treatment, a refractory fabric 16 can be placed between the layer of superconducting cable 12 and the layer of refractory cushion 18. It is also possible to place a second layer of refractory fabric 16 about the outside of the superconducting cable layer 12, such that the superconducting cable layer 12 is sandwiched between first and second refractory fabric layers 16. The refractory fabric 16 may be any suitable refractory fabric material, such as a woven fiberglass material, E-glass, or the like. In one particular arrangement, the refractory cushion layer 18 is thicker than refractory fabric 16. The refractory cushion layer 18 may be less compressible than refractory fabric 16, or be substantially uncompressible. While only one layer of superconducting cable 12 is shown in FIG. 1, additional layers of cable 12 can be wound about the spool 10 in a known manner. Layers of refractory fabric 16 can be placed about any additional wound layers of superconducting cable 12 such that each layer of superconducting cable 12 is protected by alternating layers of refractory fabric 16 as the superconducting cable 12 is wound about the spool 10. Once the desired number of layer(s) of superconducting cable 12 are wound about the spool 10, the superconducting cable 12 can be ready for reaction heat-treatment.

Figure 2A:
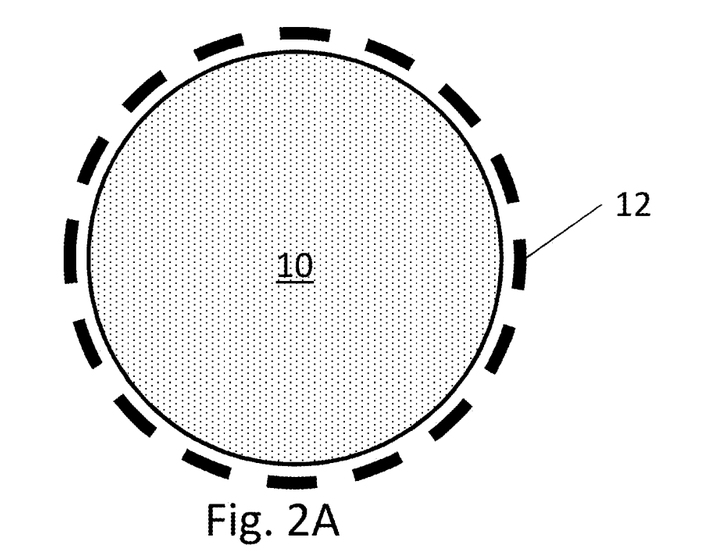
FIGS. 2A-2D are schematic representations of a heat-treatment spool and a superconducting material before and after heat-treatment to a reaction temperature.
Figure 2B:
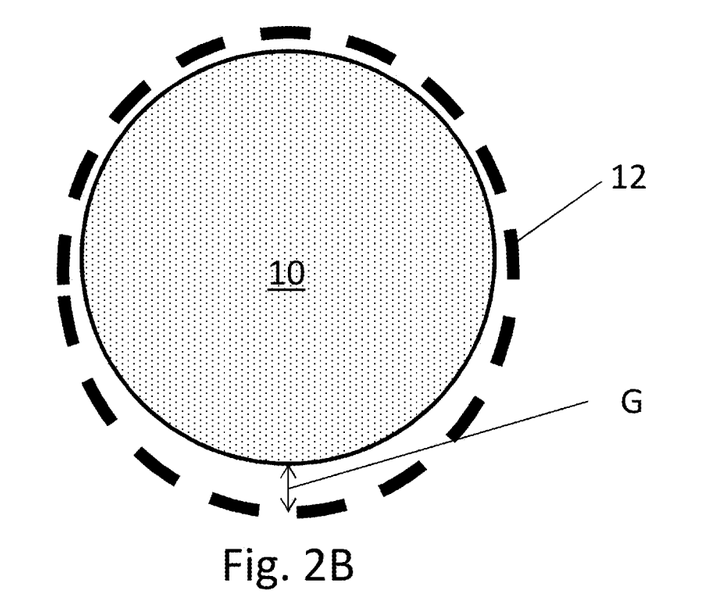

The superconducting cable 12 can be reaction heat-treated through a thermal cycle from room temperature to a reaction temperature. For example, the thermal cycle may comprise one or more temperature steps where the final step is intended for "reaction." For Nb3Sn superconductors, the temperature may range between approximately 650-700° C. depending on composite wire design and other common factors. As generally understood to those in the art, reaction temperature occurs where the phase-transformation of the precursor into superconducting stoichiometric compound takes place. FIG. 2A schematically shows a spool 10 and the superconducting material 12 prior to heat-treatment. During reaction heat-treatment, the superconducting cable 12 and the spool 10 can undergo thermal expansion/contraction, which causes these objects to undergo dimensional changes. FIG. 2B schematically shows the spool 10 and superconducting material after heat-treatment. Because the material properties of the spool 10 differ from the superconducting cable 12, a gap G can form between the superconducting cable 12 and the spool 10. The refractory cushion layer 18 seen in FIG. 1 may assist in allowing the spool 10 and cable 12 to accommodate the dimensional changes associated with the stress release process, which may otherwise damage the superconducting cable 12. However, the gap G can cause circumferential displacement of the superconducting cable 12 during pay-off of the cable 12 from the spool 10. The circumferential displacement may be caused by a differential transmission of superconducting cable layers 12 against the surface of the spool 10 or intermediary layers of material between the superconducting cable layers 12 and the spool 10. The size of the gap G may be a function of the number of rotations during pay-off and the circumferential displacement of the mark relative to its original position.

Figure 2C:
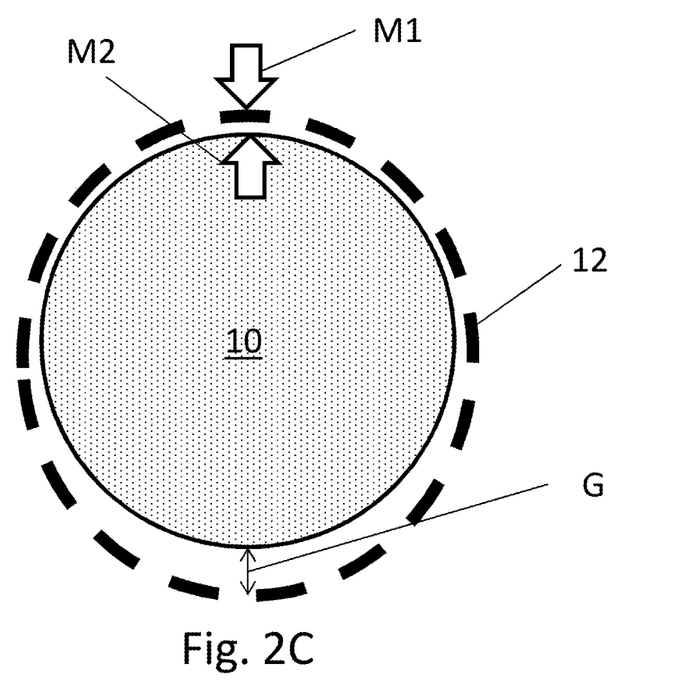
Figure 2D:
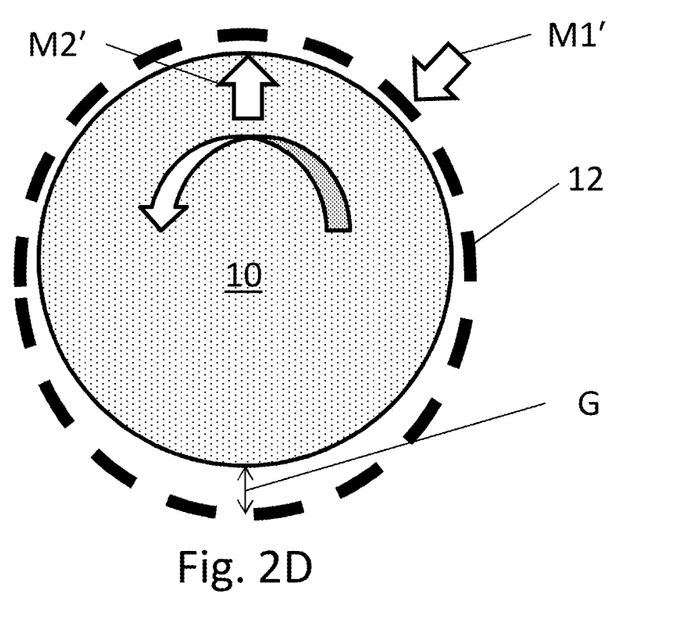

FIGS. 2C and 2D illustrate the phenomenon of circumferential displacement. FIG. 2C is a schematic representation of the spool 10 and cable 12 prior to pay-off of the cable 12. In FIG. 2C, M1 indicates an imaginary point on the cable 12, and M2 indicates an imaginary point on the spool. FIG. 2D is a schematic representation of the spool 10 and cable 12 after a complete rotation of the spool has occurred. The direction of rotation is indicated with an arrow on the spool 10 (i.e. in the counterclockwise direction). Point M2' in FIG. 2D provides a reference for visualizing the circumferential displacement of the cable 12 after a complete rotation has occurred. This is because a full rotation of the spool 10 causes the point M2' to return to its original position M2. In comparing FIG. 2C to FIG. 2D it can be seen that the point M1 has shifts to M1'. Thus, the cable 12 undergoes circumferential displacement in a direction that is away from the direction of spool-rotation during pay-off.

Figure 3A:
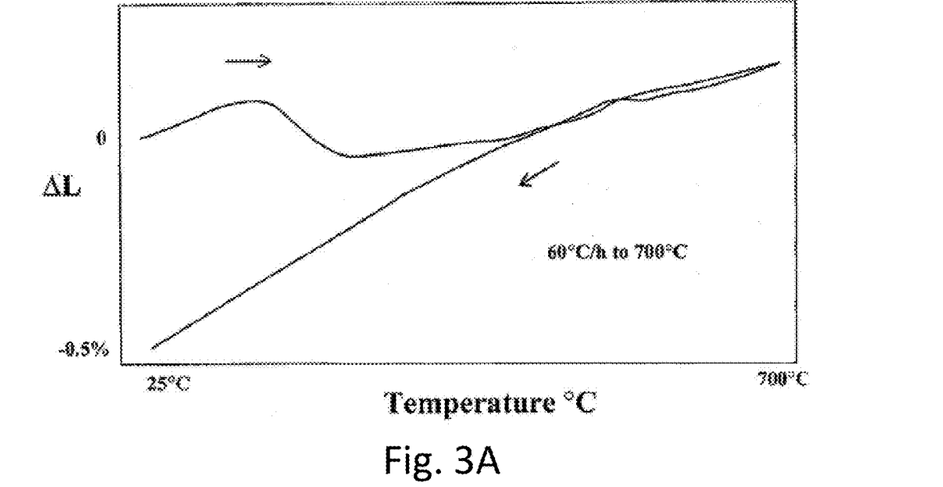
FIGS. 3A-3B depict strain behavior of exemplary superconducting materials to show the dimensional changes that occur during heat-treatment.
Figure 3B:
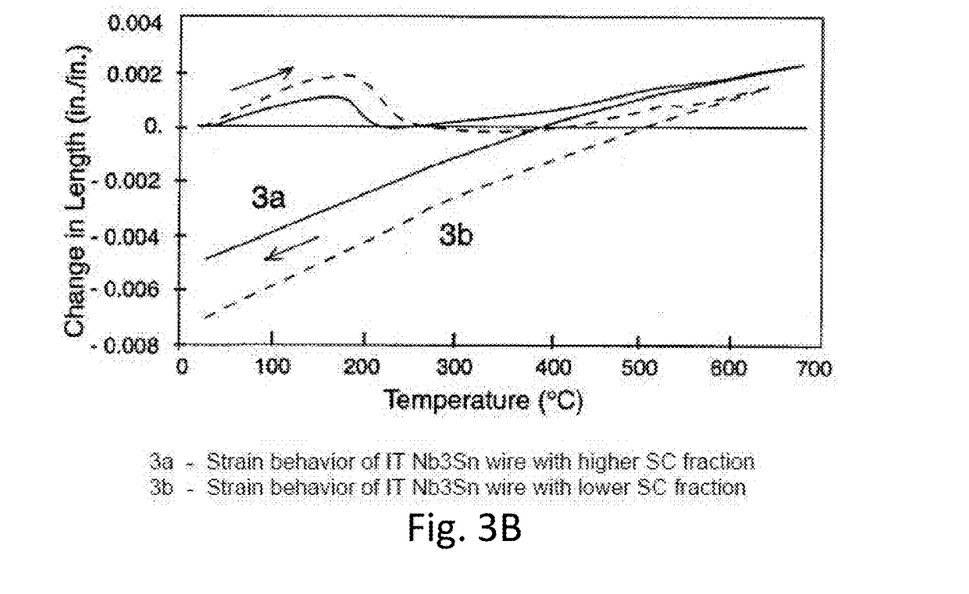

FIGS. 3A and 3B depict strain behavior of exemplary superconducting materials to show the dimensional changes that occur during heat-treatment. FIG. 3A shows an exemplary dilatometer trace of internal tin Nb$_3$Sn wire with high superconducting fraction. FIG. 3B provides a comparison of strain behavior between IT Nb$_3$Sn wire with a higher superconducting fraction to IT Nb$_3$Sn wire with a lower superconducting fraction.

The circumferential displacement and gap G between the superconducting cable 12 and spool 10 can cause damage to the cable 12 during pay-off, which may severely damage the integrity of the cable 12. Again, after heat-treatment, the cable 12 is in a particularly delicate state. An adjustment mechanism may be provided to compensate for the dimensional changes that cause circumferential displacement and gap G. In this manner, the cable 12 can be wound off of the spool 10 without causing significant damage to cable 12. More particularly, the cable 12 may be wound off the spool 10 in a consistent manner, without variations of tension being applied to the cable 12 caused by circumferential displacement and/or gap(s) between the cable 12 and spool 10.

Figure 4:
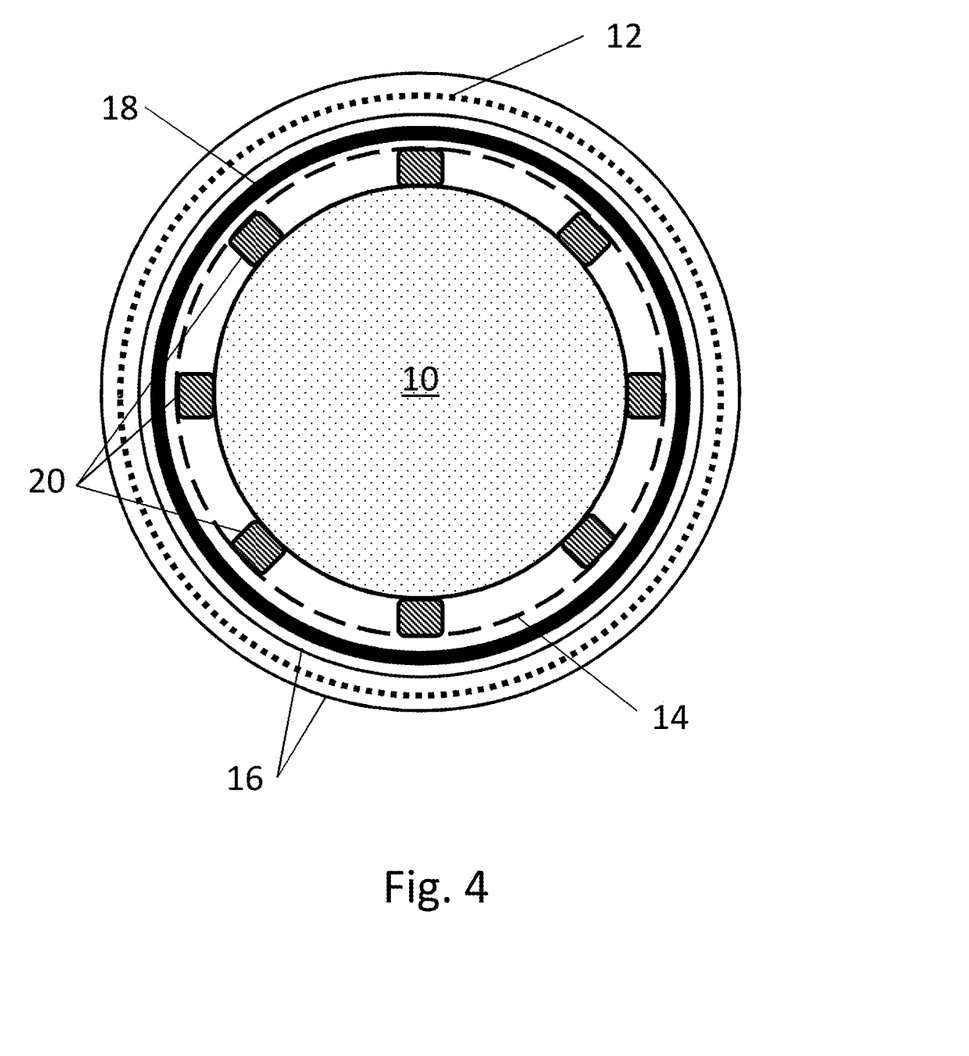
FIG. 4 is a schematic representation of the heat-treatment spool and layers of material of FIG. 1 after reaction heat-treatment.

As shown in FIG. 4, one or more adjustment mechanisms 20 may be positioned between the superconducting cable 12 and the spool 10 after dimensional changes have occurred. Specifically, the adjustment mechanisms may be placed into slots 10a provided in the outer wall of a spool 10. In this manner, the gap G between the cable 12 and spool 10 can be "filled" by the adjustment mechanisms 20. Similarly, the adjustment mechanisms 20 can be positioned after reaction heat-treating the superconducting cable is finished, and prior to removing the superconducting cable 12 from the spool 10 for further processing. In one particular embodiment, the one or more adjustment mechanisms 20 are positioned between the surface of the spool 10 and the metal sheet layer 14 (if present) at regular intervals about the circumference of the spool 10. For instance, twelve adjustment mechanisms 20 may be installed at regular 30° intervals about the spool 10.

Figure 5:
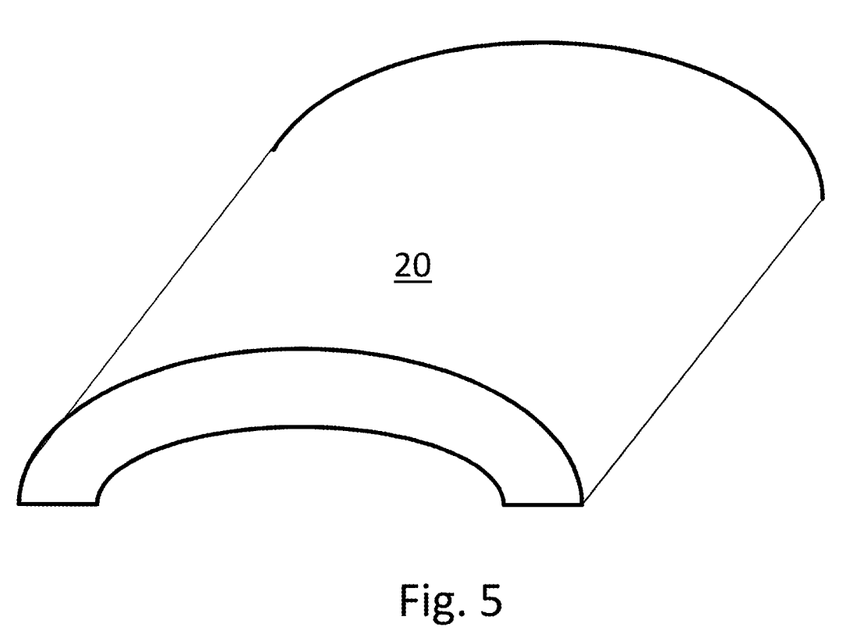
FIG. 5 depicts an exemplary adjustment mechanism.

FIG. 5 depicts an exemplary adjustment mechanism 20. The adjustment mechanism 20 can be curved along its transverse direction to match the outer diameter of the spool 10. Furthermore, the profile of the adjustment mechanism 20 can have a profile that coincides with the shape of the spool slots 10a. In this manner, the adjustment mechanisms 20 can be secured and aligned to run transversely across the spool when installed. Although it may be useful for the adjustment mechanism 20 to have a curved shape, it is possible for the adjustment mechanism 20 to have any shape for accommodating any dimensional changes of the superconducting cable. The adjustment mechanism 20 can be made of any suitable material, such as a hardened steel or stainless steel strip. The overall length of the adjustment mechanism may be 1-2 inches beyond the width of the spool 10.

A plurality of adjustment mechanisms 20 may be installed by first inserting a first adjustment mechanism 20 at location where the largest gap exists. For example, a first adjustment mechanism 20 may be installed at the bottom location (6 o'clock position) of the spool 10. The spool 10 can be slowly rotated back and forth on a flat surface to insert a next adjustment mechanism 20 at the bottom side. This process may be repeated until adjustment mechanisms 20 are installed about the spool 10, for example, at regular intervals. The installed adjustment mechanisms 20 should be hand-tight without applying any excessive force while inserting.

Alternative adjustment mechanism(s) 20 are also contemplated, including adjustment mechanisms that are integrated into the spool 10 for increasing the outer diameter of the spool 10 to accommodate any dimensional changes. For example, a plurality of folding or hinged members may be included with the spool to serve as adjustment mechanisms 20. Additionally, the spool 10, itself, may have an adjustable diameter, which serves as an adjustment mechanism.

Once the one or more adjustment mechanisms 20 are used to accommodate the dimensional changes, the reacted superconducting cable 12 can be safely removed from the spool during pay-off operation for further processing. If the reacted superconducting cable 12 is to be joined ("integrated") with a channel, then the channel and superconducting cable 12 must be cleaned and prepared. Once prepared, the reacted superconducting cable can be placed in a primary pay-off, and the cleaned channel can be placed in a secondary pay-off.

The integration process can include, for example, soldering the reacted superconducting cable 12 to a channel. The reacted superconductor can be susceptible to damage during the soldering process. Therefore, according to another embodiment of the present invention, a roller system can be provided to confine the soldered superconductor to the channel during quenching of the wire-in-channel (or cable-in-channel) superconductor without deforming the edges of the channel against the superconductor.

Figure 6:
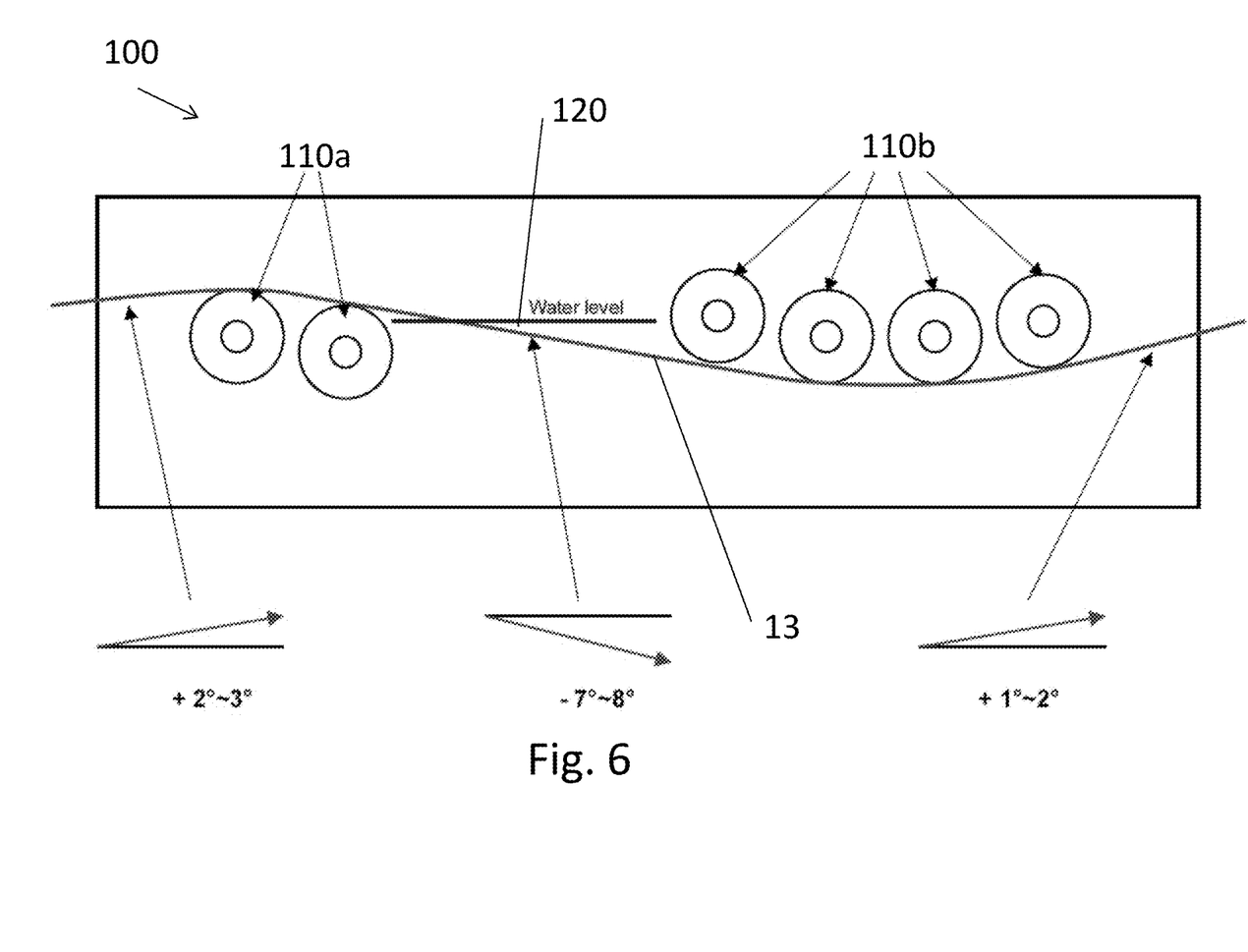
FIG. 6 depicts an exemplary roller system.

FIG. 6 shows an exemplary roller system 100 in accordance with the present disclosure. The roller system 100 may include a plurality of rollers 110a, 110b, which can carry a soldered superconducting wire-in-channel 13. The rollers 110a, 110b may be positioned such that strain on the wire-in-channel 13 during integration is limited. Advantageously, the series of rollers may be used to securely retain the superconductive wire in the channel without deforming the channel in a die, for example, deforming the channel edges against the superconductor. The rollers 110a, 110b may include a first plurality of grooved rollers 110a arranged in a concave manner relative to the floor (horizontal), and a plurality of grooved rollers 110b arranged in a convex manner relative to the floor (horizontal). The rollers 110a, 110b may be repositionable to adjust the angle at which the soldered superconductor 13 enters or exits the roller system 100.

In one particular embodiment, the concave rollers 110a may receive the wire-in-channel 13 with the solder in a molten state. The wire-in-channel 13 may be fed to a first roller of the concave rollers 110a at an incline. For example, the wire-in-channel 13 may be fed to the first roller at approximately 2-3° relative to horizontal. The incline may urge the superconducting wire or cable against the channel in order to form a suitable bond between the wire and channel. From the concave rollers 110a, the wire-in-channel 13 may be led at a decline, toward a quenching bath 120. For example, the wire-in-channel 13 may be fed at a decline at approximately 7-8° relative to horizontal. From the quenching bath 120, the wire-in-channel 13 can be fed through the plurality of convex rollers 110b, and inclined upwardly, out of the quenching bath 120. For example, the wire-in-channel 13 may be fed at in include of approximately 1-2° relative to horizontal. The rollers 110b may be used to apply a pressure against the superconductor relative to the channel to ensure that a proper bond is formed during quenching.

The integrated superconductor can be wound into a finished superconducting coil for use. This process can be conducted according to known methods, in accordance with the RAW process referenced above.

Figure 7:
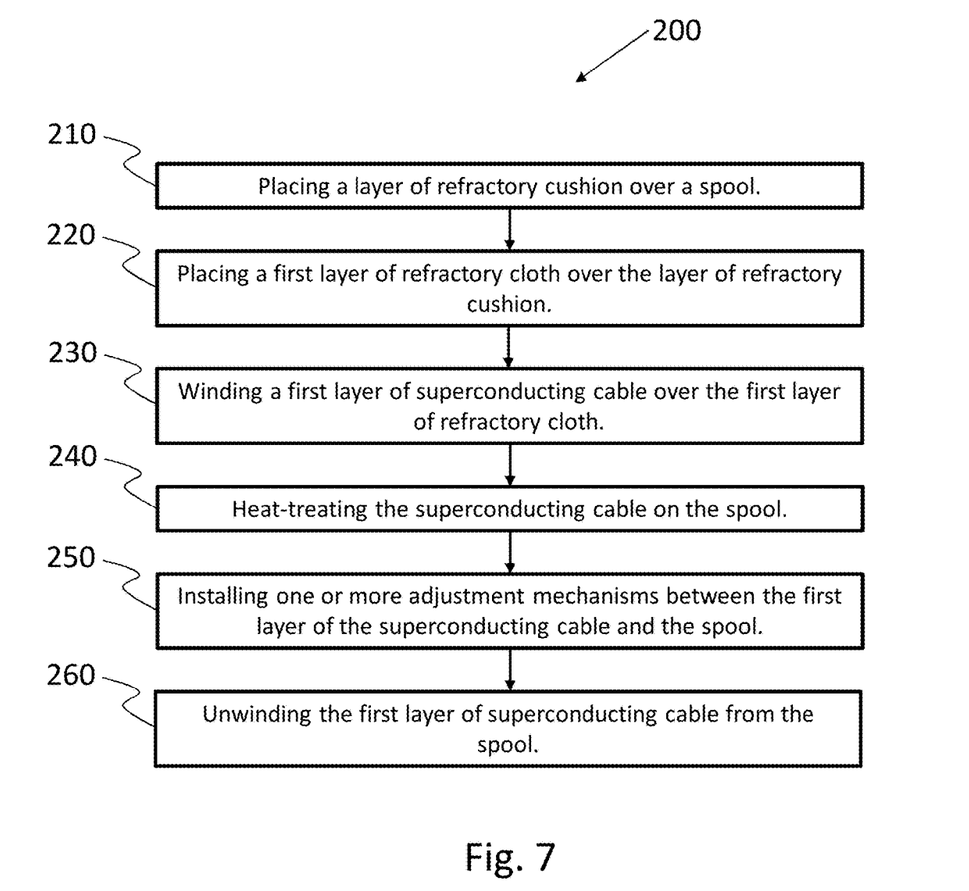
FIG. 7 depicts a method of manufacturing a superconducting material.

FIG. 7 depicts a method of manufacturing a superconducting material 200. The method can include placing 210 a layer of refractory cushion layer over a spool. A first layer of refractory cloth can be placed 220 over the layer of refractory cushion. A first layer of superconducting cable may be wound 230 over the first layer of refractory cloth. The superconducting cable can be heat-treated 240 on the spool. One or more adjustment mechanisms may be installed 250 between the first layer of the superconducting cable and the spool. The first layer of reacted superconducting cable may be unwound 260 from the spool.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A method of manufacturing a superconducting material, comprising:
    placing a layer of refractory cushion over a spool;
    winding a first layer of unreacted superconducting material over the layer of refractory cushion;
    reaction heat-treating the first layer of unreacted superconducting material on the spool to produce a first layer of reacted superconducting material;
    disposing one or more adjustment mechanisms in a gap between the spool and the first layer of reacted superconducting material, the gap formed during the reaction heat-treating from a difference in thermal expansion properties between the spool and the superconducting material; and
    unwinding the first layer of reacted superconducting material from the spool.

2. The method of claim 1, further comprising placing a first layer of refractory fabric over the layer of refractory cushion.

3. The method of claim 1, wherein the spool has a barrel diameter and includes an adjustable-diameter device to adjust the barrel diameter of the spool; and
    wherein the one or more adjustment mechanisms is the adjustable-diameter device.

4. The method of claim 3, further comprising placing a second layer of refractory fabric over the first layer of unreacted superconducting material.

5. The method of claim 4, further comprising winding a second layer of unreacted superconducting material onto the spool; and
    placing a third layer of refractory fabric over the second layer of unreacted superconducting cable.

6. The method of claim 3, further comprising compacting the superconducting material prior to winding the first layer of unreacted superconducting material onto the spool.

7. The method of claim 1, wherein the one or more adjustment mechanisms are configured to tighten the first layer of reacted superconducting material about the spool.

8. The method of claim 7, wherein the one or more adjustment mechanisms are wedging fixtures that are installed in the gap between the first layer of reacted superconducting material and the spool.

9. The method of claim 1, wherein the layer of refractory cushion is fastened to the spool.

10. The method of claim 1, wherein the superconducting material comprises one or more of the following: $Nb_3Sn$, $MgB_2$, and HTS.

11. The method of claim 2, wherein the refractory cushion is thicker than the refractory fabric.

12. The method of claim 1, wherein the refractory cushion is a refractory ceramic fiber blanket.

13. The method of claim 2, wherein the refractory fabric is made of fiberglass.

14. The method of claim 1, further comprising placing a metal sheet layer between the spool and the layer of refractory cushion.

15. The method of claim 14, wherein the metal sheet is steel.

16. The method of claim 14, further comprising installing one or more wedging fixtures between the metal sheet and the spool after the reaction heat-treating of the first layer of unreacted superconducting material on the spool.

17. The method of claim 1, further comprising soldering the first layer of reacted superconducting material to a copper channel.

18. The method of claim 1, wherein the superconducting material is one of the following: a cable, a wire, and a strand.

19. The method of claim 1, wherein the superconducting material includes Nb.

20. A method of manufacturing a superconducting material, comprising:
   providing a heat-treatment spool, including:
      a metal sheet layer over the spool;
      a layer of refractory cushion over the metal sheet layer; and
      a first layer of refractory cloth over the layer of refractory cushion;
   winding a first layer of superconducting cable about the first layer of refractory cloth;
   placing a second layer of refractory cloth over the superconducting cable;
   heat-treating the superconducting cable on the spool; and
   installing one or more wedging fixtures between the metal sheet and the spool after heat-treating the superconducting cable on the spool;
      wherein the wedging fixtures are installed in a gap between the first layer of the superconducting cable and the spool, the gap formed from a difference in thermal expansion properties between the spool and the superconducting cable;
   unwinding the superconducting cable from the spool; and
   soldering the reacted superconducting cable to a copper channel.

21. The method of claim 20, wherein the superconducting cable comprises one or more of the following: $Nb_3Sn$, $MgB_2$, and HTS.

22. The method of claim 20, further comprising winding a second layer of superconducting cable about the first layer of superconducting cable.

* * * * *

UNITED STATES PATENT AND TRADEMARK OFFICE
CERTIFICATE OF CORRECTION

PATENT NO. : 9,941,033 B2  
APPLICATION NO. : 14/205940  
DATED : April 10, 2018  
INVENTOR(S) : Pyon et al.

Page 1 of 1

It is certified that error appears in the above-identified patent and that said Letters Patent is hereby corrected as shown below:

In the Claims

Column 8, Line 46, in Claim 8:
"layer of reacted the"
Should read:
--layer of reacted--.

Signed and Sealed this
Twenty-sixth Day of June, 2018

Andrei Iancu
*Director of the United States Patent and Trademark Office*